(12) United States Patent
Mori et al.

(10) Patent No.: US 6,851,733 B2
(45) Date of Patent: Feb. 8, 2005

(54) SUCTION NOZZLE FOR HOLDING COMPONENT BY SUCTION

(75) Inventors: Kazuo Mori, Kofu (JP); Kouji Mitsushiro, Enzan (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 107 days.

(21) Appl. No.: 10/204,184

(22) PCT Filed: Feb. 21, 2001

(86) PCT No.: PCT/JP01/01245

§ 371 (c)(1),
(2), (4) Date: Aug. 19, 2002

(87) PCT Pub. No.: WO01/63999

PCT Pub. Date: Aug. 30, 2001

(65) Prior Publication Data

US 2003/0011205 A1 Jan. 16, 2003

(30) Foreign Application Priority Data

Feb. 22, 2000 (JP) ........................................ 2000-044772
Feb. 14, 2001 (JP) ........................................ 2001-036860

(51) Int. Cl.[7] ............................................... B25J 15/06
(52) U.S. Cl. ...................... 294/64.1; 414/752.1; 29/743
(58) Field of Search ............................... 294/64.1, 64.2, 294/64.3; 901/40; 414/752.1, 737, 627; 29/743

(56) References Cited

U.S. PATENT DOCUMENTS

| | | | | |
|---|---|---|---|---|
| 4,657,470 A | * | 4/1987 | Clarke et al. ................ | 414/627 |
| 5,290,081 A | | 3/1994 | Ogura | |
| 6,000,122 A | * | 12/1999 | Uchida et al. ................. | 29/740 |
| 6,328,362 B1 | * | 12/2001 | Isogai et al. ................ | 294/64.1 |
| 6,364,387 B1 | * | 4/2002 | Bolotin et al. ............. | 294/64.1 |

FOREIGN PATENT DOCUMENTS

EP 1 041 870 10/2000

OTHER PUBLICATIONS

Ong Chuan Aik et al., entitled "*Anti Suck Back Pickup Tip*", Motorola Techincal Developments, Motorola Inc., Schaumburg, Illinous, US, vol. 12, p. 140, Apr. 1, 1991.

* cited by examiner

*Primary Examiner*—Dean J. Kramer
(74) *Attorney, Agent, or Firm*—Wenderoth, Lind & Ponack, L.L.P.

(57) ABSTRACT

A suction nozzle (21) has an outer nozzle member (30), a nozzle body (40), and an urging member (50) for urging the nozzle body (40) in a direction away from the outer nozzle member (30). The suction nozzle (21) also has a spring accommodation chamber (60) defined by at least a wall surface of a nozzle body accommodation bore (32) and a proximal end face (40c) of the nozzle body (40). The spring accommodation chamber (60) is shut off from first and second suction passages (31, 32) and communicates with atmosphere. The urging member (50) is housed in the spring accommodation chamber (60).

12 Claims, 13 Drawing Sheets

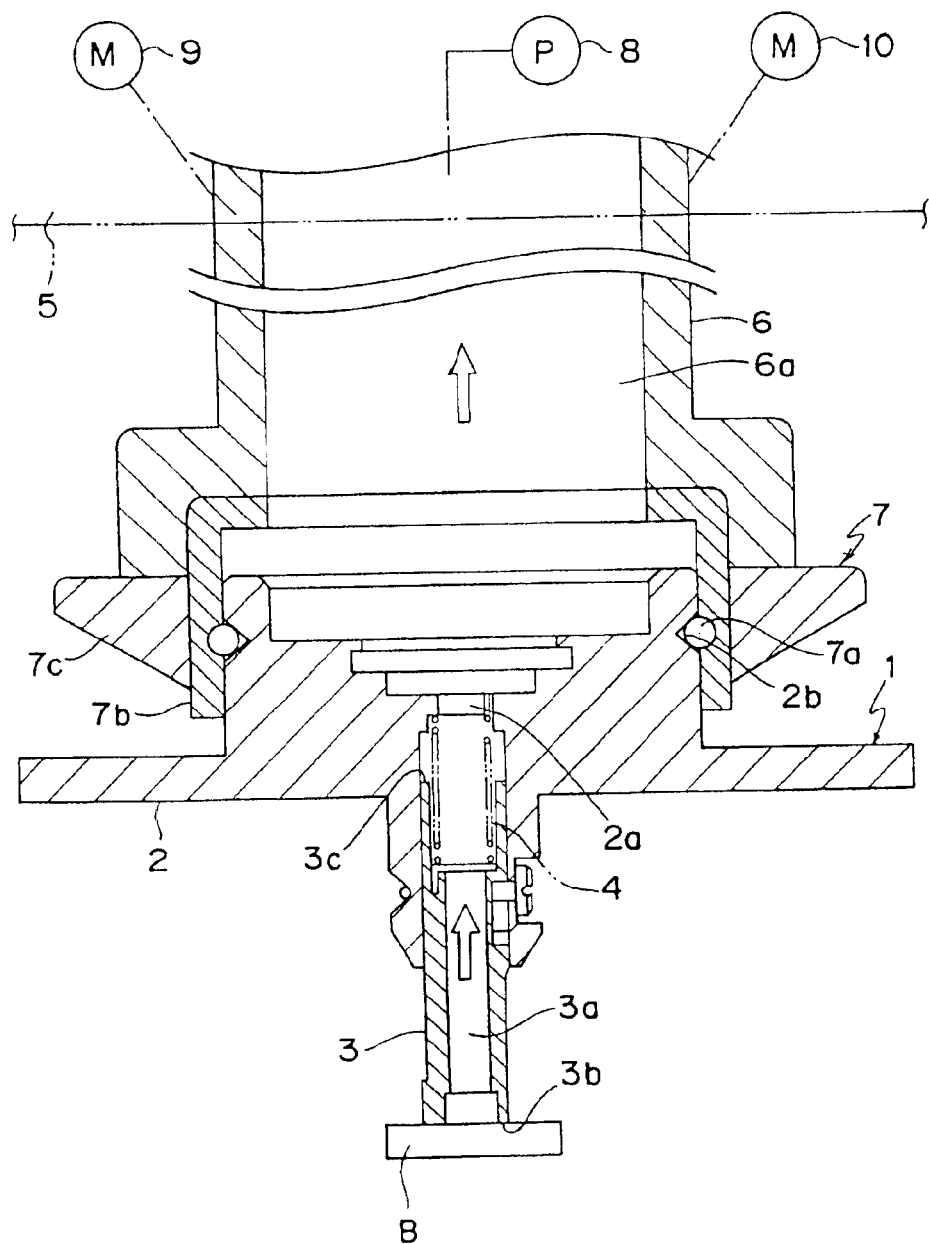
Fig.13 - PRIOR ART

SUCTION NOZZLE FOR HOLDING COMPONENT BY SUCTION

BACKGROUND OF THE INVENTION

1. Technical Field

The present invention relates to a suction nozzle, and more particularly, relates to a suction nozzle for holding a component by suction used in a component mounting apparatus for mounting a component, such as an electronic component, on a circuit formation object such as a circuit board.

2. Description of the Related Art

FIG. 13 illustrates a conventional suction nozzle 1 used for holding an electronic component B by suction in an electronic component mounting apparatus.

The suction nozzle 1 includes: an outer nozzle member 2 having a first suction passage 2a; a nozzle body 3 provided to be displaceable with respect to the outer nozzle member 2 and having a second suction passage 3a for communicating with the first suction passage 2a; and a spring 4 provided between the outer nozzle member 2 and the nozzle body 3 for elastically urging the nozzle body 3 toward a predetermined side (downward side in FIG. 13) in the displacement direction (upward and downward in FIG. 13). The second suction passage 3a extends in the displacement direction of the nozzle body 3. One end (lower end in FIG. 13) of the second suction passage 3a is open at a front end face 3b (lower end face in FIG. 13) of the nozzle body 3 in the displacement direction, whereas the other end (upper end in FIG. 13) thereof is open at a rear end face 3c (upper end face in FIG. 13) of the nozzle body 3 in the displacement direction to allow communication with the first suction passage 2a.

The suction nozzle 1 is removably attached to a nozzle shaft 6 of a mounting head section 5 of the electronic component mounting apparatus by a nozzle holder 7. The nozzle holder 7 includes an inner sleeve 7b holding balls 7a inside and an outer sleeve 7c into which the inner sleeve 7b is pressed. The balls 7a are fitted into engaging concave 2b formed on the outer nozzle member 2, and thus the suction nozzle 1 is secured to the nozzle shaft 6.

A suction passage 6a of the nozzle shaft 6 is in communication with a vacuum suction pump 8. Thus, the electronic component B is held by being sucked at the front end face 3b of the nozzle body 3 with a suction force of the vacuum suction pump 8 acting through the suction passage 6a of the nozzle shaft 6, the first suction passage 2a of the outer nozzle member 2, and the second suction passage 3a of the nozzle body 3. The nozzle shaft 6 is mechanically connected to an elevation mechanism 9 and a rotation drive mechanism 10. The suction nozzle 1 therefore moves up and down together with the nozzle shaft 6 by the elevation mechanism 9, and rotates around its axis together with the nozzle shaft 6 by the rotation drive mechanism 9.

When the electronic component B is to be picked up by suction from a component feeder section (not shown) of the electronic component mounting apparatus, the suction nozzle 1 is lowered to a predetermined height position (suction height position), where the front end face 3b of the nozzle body 3 comes into contact with the electronic component B. The electronic component B is then sucked to the front end face 3b of the nozzle body 3 with the suction force of the vacuum suction pump 8. The suction nozzle 1 holding the electronic component B by suction is lifted to the original height position.

When the electronic component B is to be placed on a circuit board (not shown), the suction nozzle 1 is lowered to a predetermined height position (placement height position), where the electronic component B comes into contact with the circuit board. The suction nozzle 1 is further lowered to apply a load to the electronic component B that is already in contact with the circuit board. By this application of a load, the electronic component B is placed on the circuit board.

The spring 4 is provided for absorbing the impact applied to the component during suction and placement of the component. More specifically, the spring 4 absorbs the impact applied to the component B when the component B comes into contact with the nozzle body 3 during the component suction operation. The spring 4 also absorbs the impact applied to the component B when the component B comes into contact with the circuit board during the component mounting operation. In consideration of only this impact absorbing function, the urging force of the spring 4 is preferably as small as possible.

During the suction of the electronic component B by the suction nozzle 1, the suction force provided by the vacuum suction pump 8 also acts on the rear end face 3c (upper end face in FIG. 13) of the nozzle body 3, urging the nozzle body 3 in the direction in which the spring 4 is compressed. If this suction force causes the nozzle body 3 to be displaced and changes the height position of the front end face 3b of the nozzle body 3, a suction error and a placement error of the electronic component B may occur. In order to avoid this displacement of the nozzle body 3 with respect to the outer nozzle member 2 due to the suction force, the urging force of the spring 4 is conventionally set at a relatively large value (for example, 3.92 to 5.88 N (400 to 600 gf)) so that the urging force can resist the suction force acting on the nozzle body 3.

However, the large urging force of the spring 4 inevitably reduces the impact absorbing function. Namely, the large urging force of the spring 4 results ins a relatively high load being applied to the electronic component B when the suction nozzle 1 comes into contact with the electronic component B during the component suction operation. Likewise, a relatively high load is applied to the electronic component B when the electronic component comes into contact with the circuit board during the component placement operation.

Some recent electronic components, on a back surface thereof, have solder balls which are to be crushed to an appropriate diameter by a load during placement. Such small-size electronic components must be placed with a low load. If a high load is applied to such electronic components during placement, the solder balls will be crushed excessively. In view of this point, the above-described conventional suction nozzle 1 is not suitable for mounting the small-size electronic components having the solder balls on the back surface thereof.

SUMMARY OF THE INVENTION

An object of the present invention is to provide a suction nozzle capable of preventing displacement of a nozzle body due to suction and also sufficiently absorbing the impact on a component during suction and placement of the component.

A first aspect of the invention provides a suction nozzle for holding a component by suction. The suction nozzle includes: an outer nozzle member defining a first suction passage for communicating with a suction source at one end thereof and a nozzle body accommodation bore; a nozzle body for holding the component at a distal end face thereof by suction, having a proximal side accommodated in the nozzle body accommodation bore so as to be slidable in a direction of an axis thereof and a distal side protruding from the outer nozzle member, the nozzle body defining a second suction passage extending in the axis direction thereof for communicating with the first suction passage, and the second suction passage having an opening at the distal end face of the nozzle body; and an urging member for urging the nozzle body in a direction away from the outer nozzle member, the urging member being accommodated in an urging member accommodation chamber defined by at least a wall surface of the nozzle body accommodation bore and a proximal end face of the nozzle body.

The suction nozzle of the present invention includes the urging member accommodation chamber formed at the proximal side of the nozzle body in which the urging member is accommodated. The urging member accommodation chamber is shut off from the first and second passages. With this construction, it is possible to reduce the suction force from the suction source acting on the nozzle body in the direction in which the urging member is compressed. Therefore, the urging force of the urging member can be set at a small value without causing displacement of the nozzle body during the suction. By setting a small urging force for the urging member, it is possible to sufficiently absorb the impact on the component during suction and placement of the component. Especially, when the urging member accommodation chamber communicates with atmosphere, reduction of the urging force of the urging member action on the nozzle body is more effectively achieved.

Specifically, the nozzle body is provided with a first cylindrical portion protruding from the proximal end face thereof. The nozzle body is movable against an urging force of the urging member from a first position, where a distal end face of the first cylindrical portion is apart from a bottom wall surface of the nozzle body accommodation bore, to a second position where the distal end face of the first cylindrical portion contacts the bottom wall surface of the nozzle body accommodation bore.

After the nozzle body reaches the second position, the nozzle body moves integrally with the outer nozzle member. During component placement, therefore, the suction nozzle in this state presses the component against the circuit formation object, applying a load required for the mounting. This load can be set irrespective of the urging force of the urging member.

The urging member may be a spring. The urging force of the spring, for example, may be set not less than 0.196 N and not more than 0.98 N.

A first annular groove for enlarging the diameter of the nozzle body accommodation bore may be formed on a portion of the side peripheral wall surface of the nozzle body accommodation bore adjacent to the bottom wall surface. The existence of the first annular groove can reduce sliding resistance generated when the nozzle body moves in the nozzle body accommodation bore. In addition, this prevents intrusion of an end of the first cylindrical portion of the nozzle body into the peripheral wall surface of the nozzle body accommodation bore.

A countersink may be formed on the bottom wall surface for securing the urging member. By being secured to the countersink, the urging member is stably held in the urging member accommodation chamber and thus prevented from intruding between the outer nozzle member and the nozzle body.

The structure for communication of the first suction passage with the second suction passage is not specifically restricted. For example, the nozzle body may define at least one lateral passage extending in a direction crossing the axis of the nozzle body and communicating with the second suction passage at one end thereof, and the other end of the lateral passage may communicate with the other end of the first suction passage of the outer nozzle member.

The nozzle body may define a single lateral passage. Alternatively, the nozzle body may define two lateral passages, and the two lateral passages may be symmetric with respect to the axis of the nozzle body so that the suction force from the suction source uniformly acts on the outer side peripheral wall surface of the nozzle body.

In order to attain further uniform suction force acting on the outer side peripheral wall surface of the nozzle body, a second annular groove may be formed around the outer side peripheral wall surface of the nozzle body, and the lateral passage may be allowed to communicate with the other end of the first suction passage through the second annular groove.

Alternatively, the nozzle body may include a second cylindrical portion extending in the axis direction from the proximal end face. The second cylindrical portion may extend through the urging member accommodation chamber into the first suction passage. The second suction passage may be allowed to communicate with the first suction passage through a third suction passage formed through the second cylindrical portion. With this construction, the spring accommodation chamber can be shut off from the first and second suction passages more reliably.

The outer nozzle member may define a first vacuum breaking passage communicating with atmosphere at one end thereof. Further, the nozzle body may define a second vacuum breaking passage communicating with the second suction passage at one end thereof. The other ends of the first and second vacuum breaking passages are shut off from each other when the suction nozzle holds the component by suction. On the other hand, the other ends of the first and second vacuum breaking passages communicate with each other when the suction nozzle places the component onto a circuit formation object.

The other ends of the first and second vacuum breaking passages may be shut off from each other when the nozzle body is in the first position, and may communicate with each other when the nozzle body is in the second position, allowing the second suction passage to be open to atmosphere. With this construction, the sucking of the component to the nozzle body can be released smoothly and reliably when the nozzle body comes into contact with the outer nozzle member. For example, when the component sucked to at the nozzle body is pressed against the circuit formation object, and thus the nozzle body reaches the second position, the first and second vacuum breaking passages communicate with each other, therefore resulting in the release of the suction.

A second aspect of the present invention provides a component mounting apparatus for placing a component on, a circuit formation object. The apparatus includes: a component feeder section for feeding the component; a circuit formation object transfer section for transferring the circuit formation object to a component placement location; and a mounting head section provided with the above-mentioned suction nozzle. The mounting head section is moved from the component feeder section to the component placement location, wherein when the mounting head section is situated at a position corresponding to the component feeder section, the suction nozzle holds the component fed from the component feeder section by sucking the component at the distal end of the nozzle body, and wherein when the mounting head section is situated at the component placement location, the suction nozzle moves toward the circuit formation object and places the component sucked at the distal end of the nozzle body onto the circuit formation object.

A third aspect of the present invention provides a method for mounting a component on a circuit formation object using a suction nozzle comprising an outer nozzle member, a nozzle body slidable in a direction of an axis thereof with respect to the outer nozzle member, and an urging member for urging the nozzle body in a direction away from the outer nozzle member comprising: holding the component by suction at a distal end of the nozzle body; moving the suction nozzle to a position above the circuit formation object; moving the suction nozzle in the direction of the axis of the nozzle body toward the circuit formation object to reach a first height position where the component sucked at the distal end of the nozzle body comes into contact with the circuit formation object while the urging member absorbs an impact on the component caused by the contact with the circuit formation object; moving the suction nozzle in the direction of the axis of the nozzle body toward the circuit formation object, from the first height position to a second position where a proximal side of the nozzle body is engaged with the outer nozzle member, with moving the nozzle body with respect to the outer nozzle member against an urging force of the urging member; and further moving the suction nozzle in the direction of the axis of the nozzle body, from the second height position toward the circuit formation object, so that a load is applied to the component from the nozzle body, the component being placed onto the circuit formation object by the load. The sucking of the component by the nozzle body may be released when the suction nozzle reaches the second height position.

BRIEF DESCRIPTION OF THE DRAWINGS

FIG. 13 is a vertical cross-sectional view illustrating a conventional suction nozzle.

DETAILED DESCRIPTION OF THE INVENTION

Figure 1:
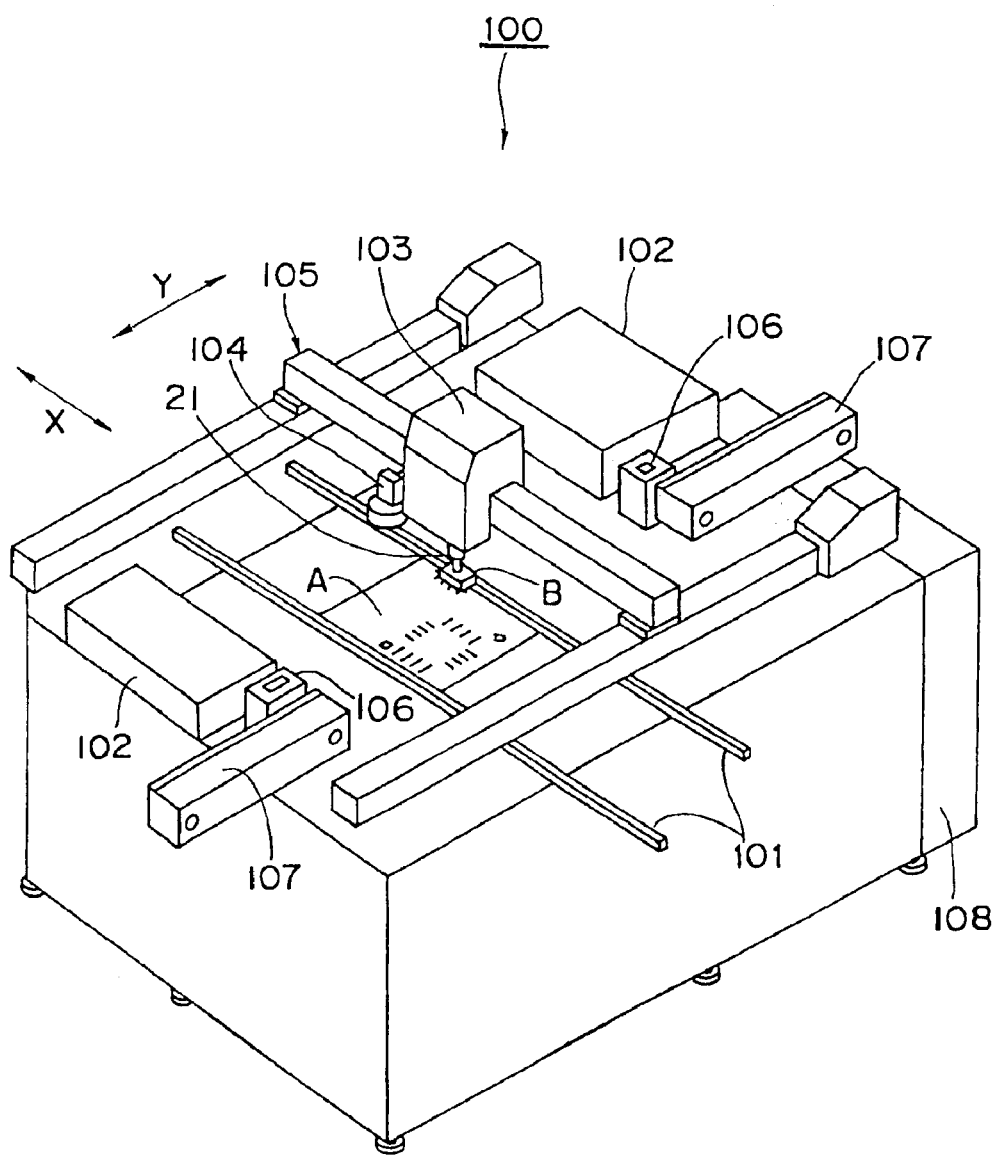
FIG. 1 is a perspective view illustrating an electronic component mounting apparatus provided with a suction nozzle of the present invention.

The present invention will now be described in detail in accordance with embodiments illustrated in the drawings.

First Embodiment

FIG. 1 illustrates an electronic component mounting apparatus 100 provided with a suction nozzle 21 of the present invention. FIGS. 2 to 5 illustrate the suction nozzle 21 of the first embodiment.

Referring to FIG. 1, the electronic component mounting apparatus 100 includes: a board transfer section 101 for transferring a circuit board A; component feeder sections 102 including a plurality of component feeder units; a mounting head section 103 to which the suction nozzle 21 can be attached; a board recognition camera 104 for recognizing the circuit board A; an X-Y robot 105 capable of moving the mounting head section 103 and the board recognition camera 104 in directions shown by arrows X and Y in FIG. 1; component imaging units 106 for imaging the posture of an electronic component B sucked and held by the suction nozzle 21; component discard sections 107 for discarding the electronic component B if the posture thereof is found abnormal; and a control unit 108 for controlling these operations.

Figure 2:
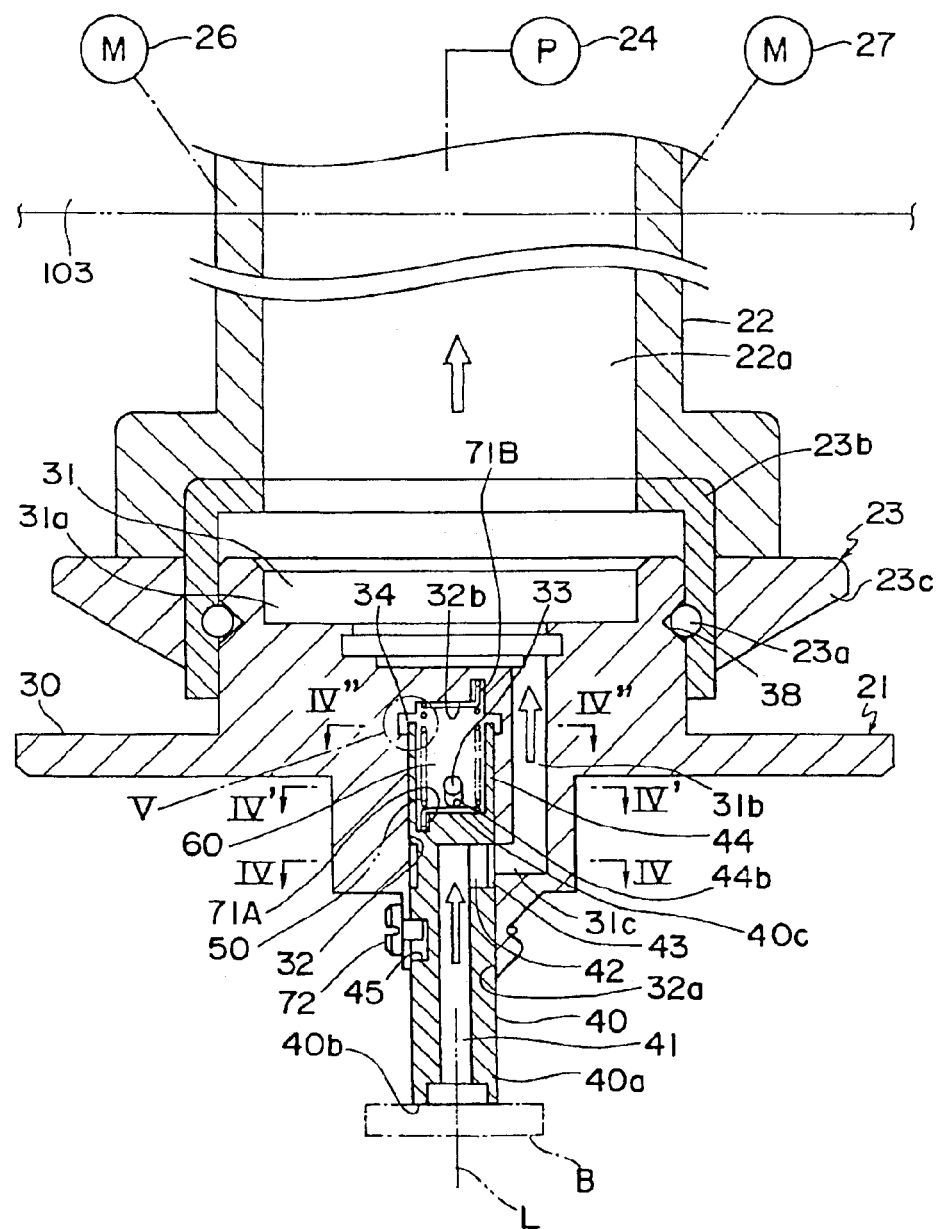
FIG. 2 is a vertical cross-sectional view illustrating a suction nozzle constructed in accordance with a first embodiment of the present invention.
Figure 3:
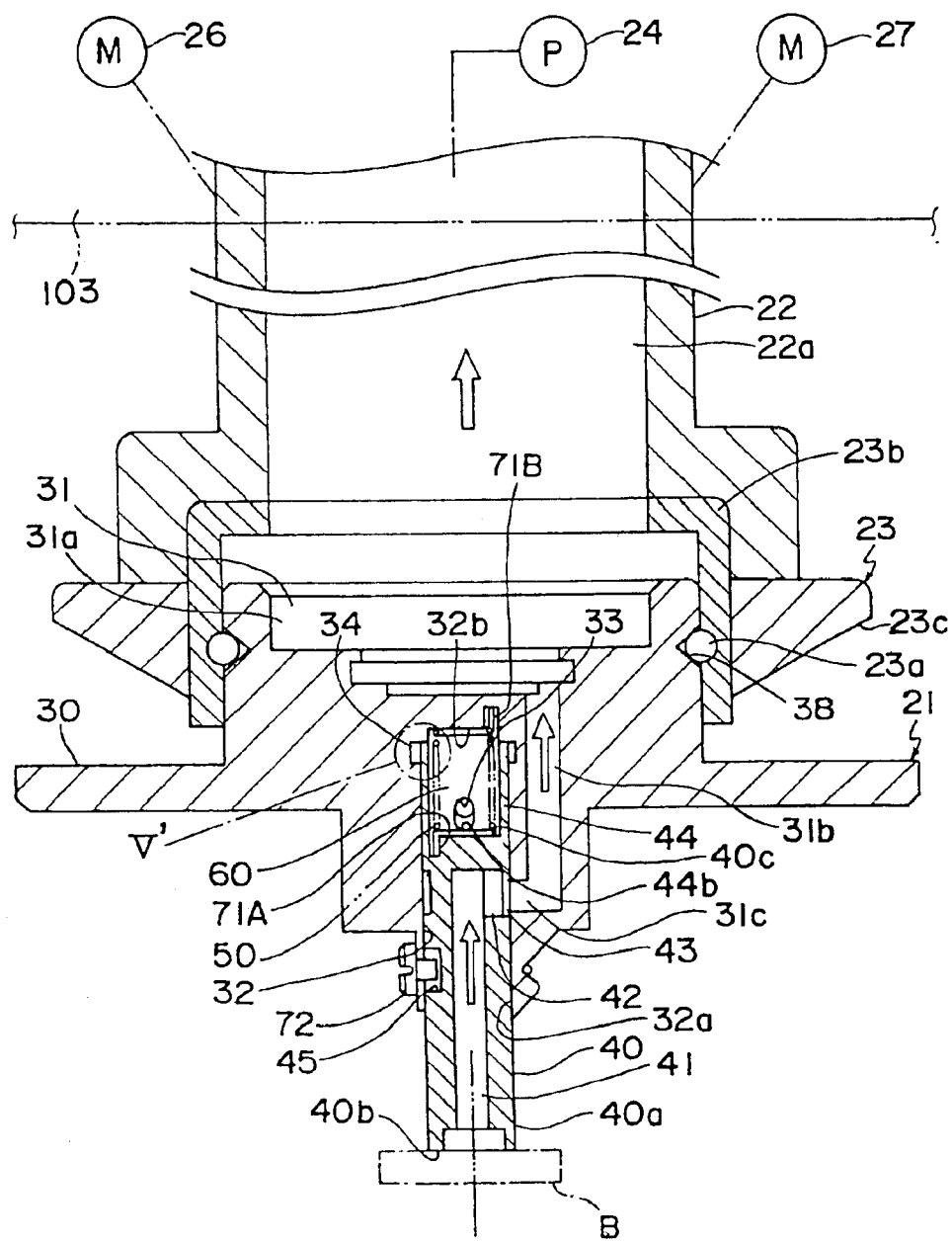
FIG. 3 is a vertical cross-sectional view illustrating the suction nozzle of the first embodiment.

Referring to FIG. 2, the suction nozzle 21 is removably attached to a nozzle shaft 22 of the mounting head section 103 by a nozzle holder 23. Specifically, the nozzle holder 23 includes an inner sleeve 23b holding balls 23a and an outer sleeve 23c in which the inner sleeve 23b is pressed. The balls 23a are fitted into engage concave 38 formed on an outer nozzle member 30 to be described later, and thus the suction nozzle 21 is secured to the nozzle shaft 22.

A suction passage 22a of the nozzle shaft 22 is in communication with a vacuum suction pump 24. The nozzle shaft 22 is mechanically connected to an elevation mechanism 26 and a rotation drive mechanism 27. The suction nozzle 21 therefore moves up and down together with the nozzle shaft 22 by the elevation mechanism 26, and rotates around an axis thereof together with the nozzle shaft 22 by the rotation drive mechanism 27.

The suction nozzle 21 includes the outer nozzle member 30, a nozzle body 40, and a spring 50.

The outer nozzle member 30 is formed with a first suction passage 31 and a nozzle body accommodation bore 32. The first suction passage 31 includes: a comparative large-diameter first portion 31a communicating with the suction passage 22a of the nozzle shaft 22; a second portion 31b communicating with the first portion 31a at one end thereof and extending in the direction of an axis L of the nozzle body 40; and a third portion 31c extending from the other end of the second portion 31b in a direction perpendicular to the second portion 31b. The third portion 31c is open at a side peripheral wall surface 32a of the nozzle body accommodation bore 32.

A proximal side of the nozzle body 40 is accommodated in the nozzle body accommodation bore 32 of the outer nozzle member 30 so as to be slidable in the direction of the axis L thereof. An outer side peripheral wall surface 40a of the nozzle body 40 closely or airtightly touches the side peripheral wall surface 32a of the nozzle body accommodation bore 32. A distal side of the nozzle body 40 protrudes from the outer nozzle member 30 downward as shown in FIG. 2.

The nozzle body 40 is formed with a second suction passage 41 that extends in the direction of the axis L and is open at a distal end face 40b thereof. The nozzle body 40 is also formed with a lateral passage 42 extending in: a direction perpendicular to the axis L. The lateral passage 42 communicates with the second suction passage 41 at one end thereof and is open at the outer side peripheral wall surface 40a of the nozzle body 40 at the other end thereof.

Figure 4A:
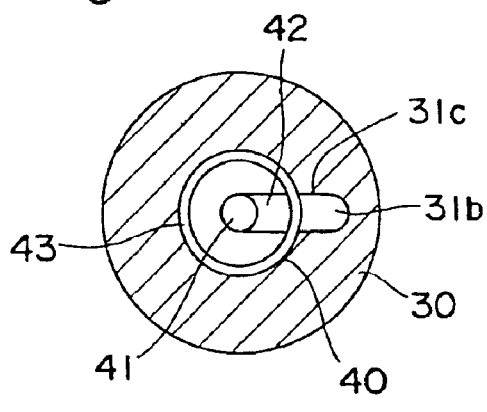
FIG. 4A is a cross-sectional view taken along line IV—IV in FIG. 2.
Figure 4B:
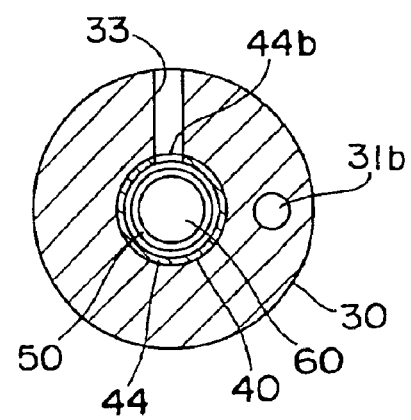
FIG. 4B is a cross-sectional view taken along line IV'—IV' in FIG. 2.
Figure 4C:
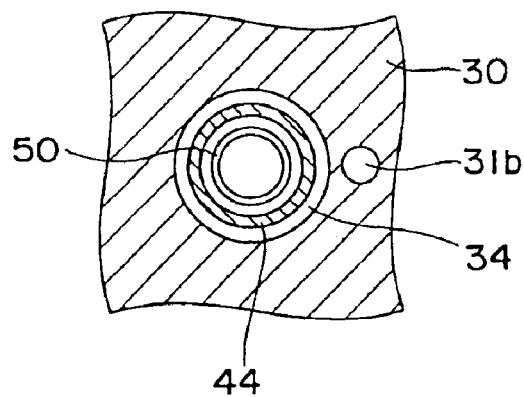
FIG. 4C is a cross-sectional view taken along line IV"—IV" in FIG. 2.
Figure 5A:
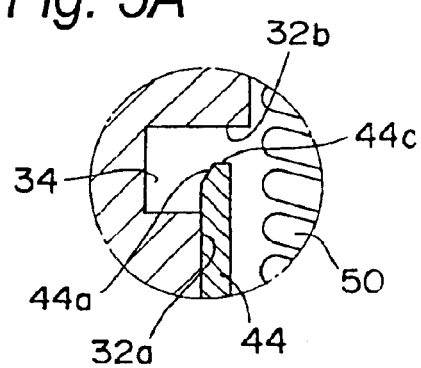
FIG. 5A is a partial enlarged view of a portion V in FIG. 2.
Figure 5B:
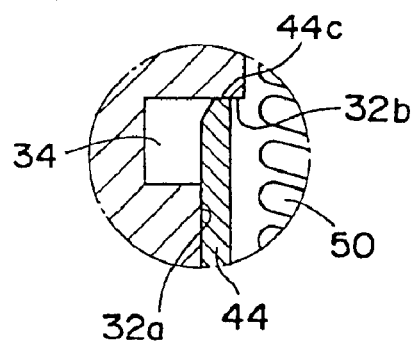
FIG. 5B is a partial enlarged view of a portion V' in FIG. 3.

As shown in FIGS. 2 and 4A, an annular groove 43 is formed at a position of the outer side peripheral wall surface 40a of the nozzle body 40 corresponding to the opening of the lateral passage 42. The second suction passage 41 communicates with the third portion 31c of the first suction passage 31 through the annular groove 43 and the lateral passage 42. As shown in FIGS. 2 and 4B, a first cylindrical portion 44 protrudes from a proximal end face 40c of the nozzle body 40 in the direction of the axis L. As shown in FIGS. 5A and 5B, the distal end of the cylindrical portion 44 is beveled as denoted by reference numeral 44a to facilitate insertion of the nozzle body 40 into the nozzle body accommodation bore 32 during manufacture.

A space shut off from the first and second suction passages 31, 41, that is, a spring accommodation chamber 60 is defined by the proximal end face 40c of the nozzle body 40, a bottom wall surface 32b of the nozzle body accommodation bore 32, the side peripheral wall surface 32a of the nozzle body accommodation bore 32, and the first cylindrical portion 44. As shown in FIGS. 2 and 4B, the spring accommodation chamber 60 communicates with atmosphere through an elliptical bore 44b formed through the first cylindrical portion 44 and a circular sectional passage 33 formed at a position of the outer nozzle member 30 corresponding to the elliptical bore 44b. Therefore, the pressure in the spring accommodation chamber 60 is kept at atmospheric pressure irrespective of the position of the nozzle body 40 with respect to the outer nozzle member 30 and the existence or absence of a suction force applied by the vacuum suction pump 24. In other words, the suction force of the vacuum suction pump 24 does not act on the proximal end face 40c of the nozzle body 40.

A helical spring 50 is accommodated in the compression state in the spring accommodation chamber 60. The spring 50 elastically urges the nozzle body 40 in the direction away from the outer nozzle member 30. Since the suction force of the vacuum suction pump 24 does not act on the proximal end face 40c of the nozzle body 40 as described above, the urging force of the spring 50 is not required to be large in order to resist the suction force. Therefore, the urging force of the spring 50 can be set at a relatively small value. Specifically, the urging force of the spring 50 may be set not less than 0.196 N and not more than 0.98 N.

Accommodation of the spring 50 in the spring accommodation chamber 60 will be described in detail. The spring 50 is placed inside the cylindrical portion 44. Countersinks 71A, 71B are each formed on the proximal end face 40c of the nozzle body 40 and the bottom wall surface 32b of the nozzle body accommodation bore 32 both defining the spring accommodation chamber 60. Ends of the spring 50 are each inserted in the countersinks 71A, 71B, so that the spring 50 is stably held in the spring accommodation chamber 60. Thus, the spring 50 is prevented from intruding into the space between the outer nozzle member 30 and the nozzle body 40.

As shown in FIGS. 2, 4C, 5A, and 5B, an annular groove 34 is formed at a position of the side peripheral wall surface 32a of the nozzle body accommodation bore 32 adjacent to the bottom wall surface 32b. A diameter of the nozzle body accommodation bore 32 is larger in this portion with the annular groove 34 than the other portion. Therefore, in this portion, the first cylindrical portion 44 of the nozzle body 40 is not in contact with the side peripheral wall surface 32a of the nozzle body accommodation bore 32 as shown in FIGS. 5A and 5B. This advantageously reduces the sliding resistance on the nozzle body 40 when it slides inside the nozzle body accommodation bore 32. In addition, the existence of the annular groove 34 prevents the distal end of the first cylindrical portion 44 from being engaged in the side peripheral wall 32a of the nozzle body accommodation bore 32.

An engage groove 45 extending in the direction of the axis L is formed on the outer side peripheral wall surface 40a of the nozzle body 40. A stopper 72 secured to the outer nozzle member 30 is loosely inserted in the engage groove 45 so that a distal end of the stopper 72 is movable in the engage groove 45. By engagement of an end portion of the engage groove 45 with the stopper 72 as shown in FIG. 2, the nozzle body 40 is prevented from coming off from the nozzle body accommodation bore 32 due to the urging force of the spring 50.

The suction force of the vacuum suction pump 24 acts on the electronic component B at the distal end face 40b of the nozzle body 40 through the suction passage 22a of the nozzle shaft 22, the first suction passage 31 of the outer nozzle member 30, the annular groove 43 of the nozzle body 40, the lateral passage 42 of the nozzle body 40, and the second suction passage 41 of the nozzle body 40. With the existence of the annular groove 43 of the nozzle body 40, the suction force of the vacuum suction pump 24 fails to directly act on the outer side peripheral wall surface 40a of the nozzle body 40 at a junction between the first suction passage 31 of the outer nozzle member 30 and the lateral passage 42 of the nozzle body 40. This prevents the nozzle body 40 from being sucked to the outer nozzle member 30 at the junction due to the suction force of the vacuum suction pump 24, and thus ensures a reduction in sliding resistance generated when the nozzle body 40 is displaced with respect to the outer nozzle member 30.

When no upward force along the axis L acts to the distal end face 40b, the nozzle body 40 is in a first position shown in FIG. 2 where the nozzle body 40 is stopped by the stopper 72. In this first position, as shown in FIG. 5A, an end face 44c of the first cylindrical portion 44 of the nozzle body 40 is apart from the bottom wall surface 32b of the nozzle body accommodation bore 32. Once an upward force, along the axis L, acts to the distal end face 40b, the nozzle body 40 moves upwardly toward a second position shown in FIG. 3 against the urging force of the spring 50. In this second position, as shown in FIG. 5B, the end face 44c of the first cylindrical portion 44 of the nozzle body 40 is in contact with the bottom wall surface 32b of the nozzle body accommodation bore 32.

Then, the operation of the electronic component mounting apparatus 100 having the suction nozzle 21 will be described.

First, the board transfer section 101 transfers the circuit board A to a component placement location. During this transfer, the board recognition camera 104 is moved to be located above the circuit board A by the X-Y robot 105 to recognize a position on the circuit board A at which the electronic component B is to be placed.

The mounting head section 103 is then moved to the component feeder section 102 by the X-Y robot 105, where the suction nozzle 21 sucks and holds the electronic component B fed from the component feeder section 102 in the following manner.

First, the suction nozzle 21 is lowered to a predetermined height position (suction height position) by the elevation mechanism 26, to allow the distal end face 40b of the nozzle body 40 to come into contact with the electronic component B fed from the component feeder section 102. In this case, the impact applied to the electronic component B can be sufficiently absorbed since the urging force of the spring 50 is relatively small as described above.

Subsequently, the electronic component B is sucked to the distal end face 40b of the nozzle body 40 with the suction force of the vacuum suction pump 24 acting through the first suction passage 31 of the outer nozzle member 30, the lateral passage 42 of the nozzle body 40, and the second suction passage 41 of the nozzle body 40. In this case, the nozzle body 40 is prevented from being displaced with respect to the outer nozzle member 30 due to the suction force of the vacuum suction pump 24. This is because the spring accommodation chamber 60 provided at the proximal side of the nozzle body 40 serves to reduce the suction force of the vacuum suction pump 24 acting on the nozzle body 40 in the direction of the axis L (direction in which the spring 50 is compressed). It is therefore possible to keep constant the height position of the distal end face 40b of the nozzle body 40 holding the electronic component B by suction. Thereafter, the suction nozzle 21 holding the electronic component B is moved upwardly to the original height position by the elevation mechanism 26.

The mounting head section 103 is then moved by the X-Y robot 105 so that the electronic component B held by the suction nozzle 21 passes over the component imaging device 106. During this passing, the component imaging device 106 takes an image of the posture of the electronic component B held by the suction nozzle 21. Based on the results of this imaging, the control unit 108 determines whether or not the posture of the electronic component B is appropriate. If the posture of the electronic component B is determined appropriate, the position of the electronic component B is then corrected based on the image information obtained. More specifically, the suction nozzle 21 is rotated around the axis L by the rotation drive mechanism 27 to correct the rotational position of the electronic component B.

Thereafter, the mounting head section 103 is moved to the component mounting location by the X-Y robot 105, where the electronic component B held by the suction nozzle 21 is placed onto the circuit board A in the following manner. First, the suction nozzle 21 is lowered to a predetermined height position (placement height position) by the elevation mechanism 26, to allow the electronic component B sucked at the distal end face 40b to come into contact with the circuit board A. In this case, the impact applied to the electronic component B can be sufficiently absorbed since the urging force of the spring 50 is relatively small as described above.

The suction nozzle 21 is further lowered from the placement height position. As a result, the nozzle body 40 moves toward the outer nozzle member 30 against the urging force of the spring 50 to reach the second position (see FIG. 2). In this case, only a small load is applied to the electronic component B since the urging force of the spring 50 is relatively small.

In the second position, the end face 44c of the first cylindrical portion 44 of the nozzle body 40 is in contact with the bottom wall surface 32b of the nozzle body accommodation bore 32 of the outer nozzle member 30 as described above. Therefore, as the suction nozzle 21 is further lowered, the nozzle body 40 is lowered together with the outer nozzle member 30 without being displaced with respect to the outer nozzle member 30. As a result, a load is applied from the nozzle body 40 to the electronic component B that has been already in contact with the circuit board A. With this load, the electronic component B is placed onto the circuit board A. After completion of the placement, the suction of the vacuum suction pump 24 is halted. Thereafter, the suction nozzle 21 is moved upwardly to the original height position.

If it is determined that the posture of the electronic component B is inappropriate according to the imaging results by the component imaging device 106, the mounting head section 103 is moved to the component discard section 107 by the X-Y robot 105. In the component discard section 107, the suction of the vacuum suction pump 24 is released in order to discard the electronic component B sucked to the suction nozzle 21.

Second Embodiment

Figure 6:
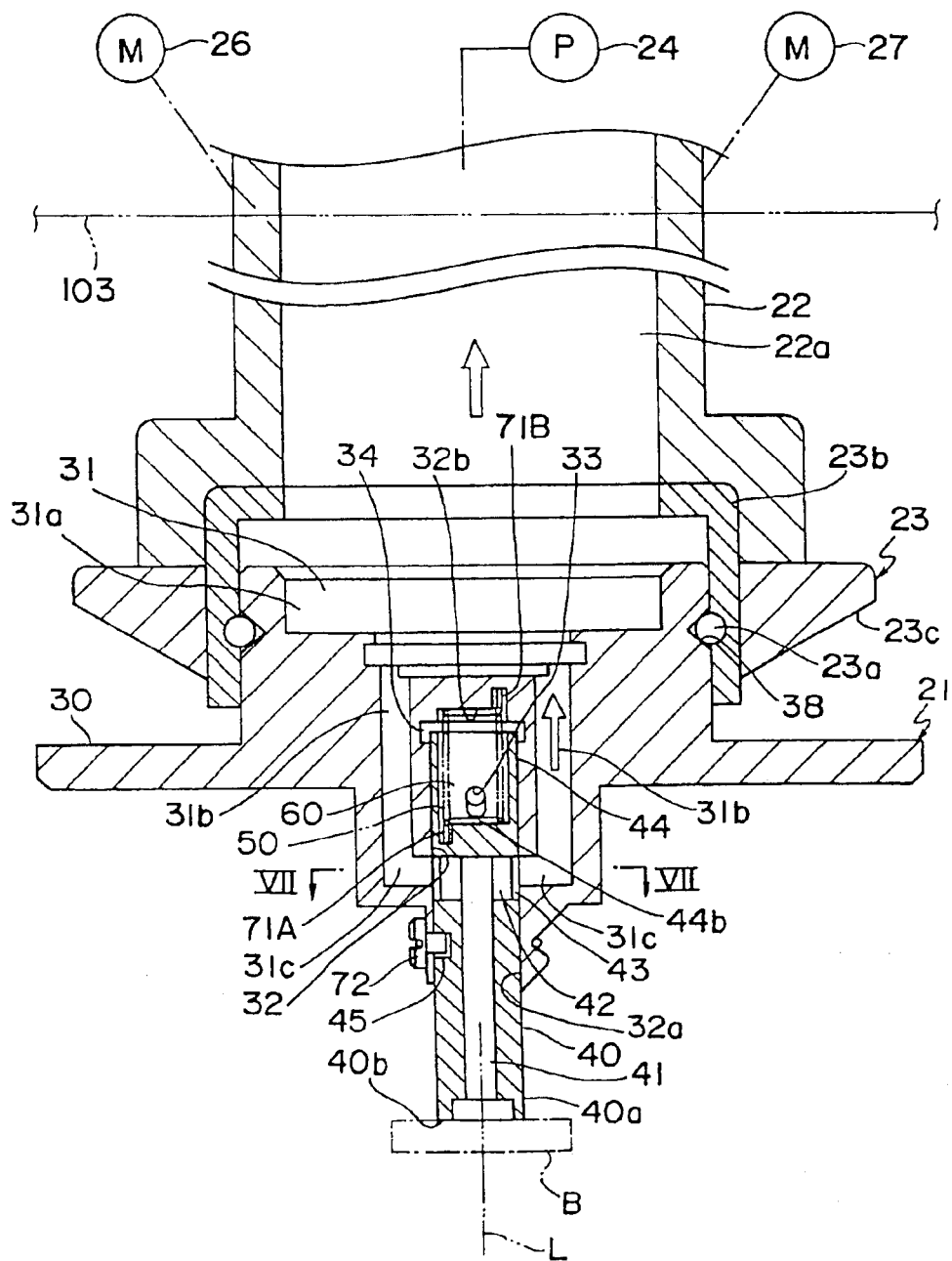
FIG. 6 is a vertical cross-sectional view illustrating a suction nozzle constructed in accordance with a second embodiment of the present invention.
Figure 7:
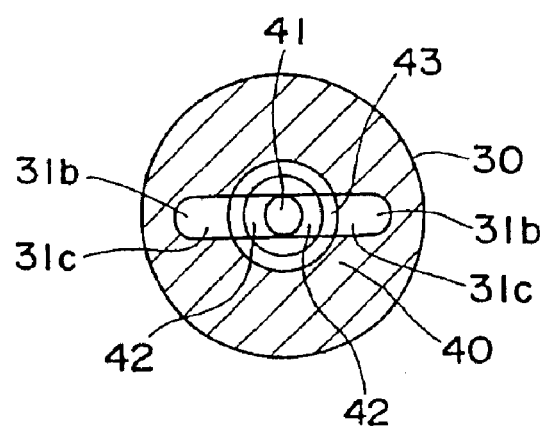
FIG. 7 is a cross-sectional view taken along line VII—VII in FIG. 6.

FIGS. 6 and 7 illustrate a suction nozzle 21 of the second embodiment of the present invention. In this embodiment, the nozzle body 40 includes two lateral passages 42, 42 formed symmetrically with respect to the axis L of the nozzle body 40. Namely, these lateral passages 42, 42 are formed at positions apart from each other by 180 degrees with respect to the axis L. In addition, the first suction passage 31 of the outer nozzle member 30 includes two second portions 31b, 31b and two third portions 31c, 31c to communicate with the two lateral passages 42, 42. These second portions 31b, 31b and third portions 31c, 31c are also formed at positions apart from each other by 180 degrees with respect to the axis L.

In the second embodiment, the suction force of the vacuum suction pump 24 acts on the second suction passage 41 of the nozzle body 40 through the two lateral passages 42, 42. This makes more uniform the suction force acting on the outer side peripheral wall surface 40a of the nozzle body 40, and thus more reliably prevents the nozzle body 40 from being sucked to the outer nozzle member 30 due to the suction force of the vacuum suction pump 24. As a result, sliding resistance can be reduced more reliably during the displacement of the nozzle body 40 with respect to the outer nozzle member 30.

The other construction and function of the second embodiment are the same as those of the first embodiment described above. Therefore, the same components are denoted by the same reference numerals, and the description thereof is omitted.

Third Embodiment

Figure 8:
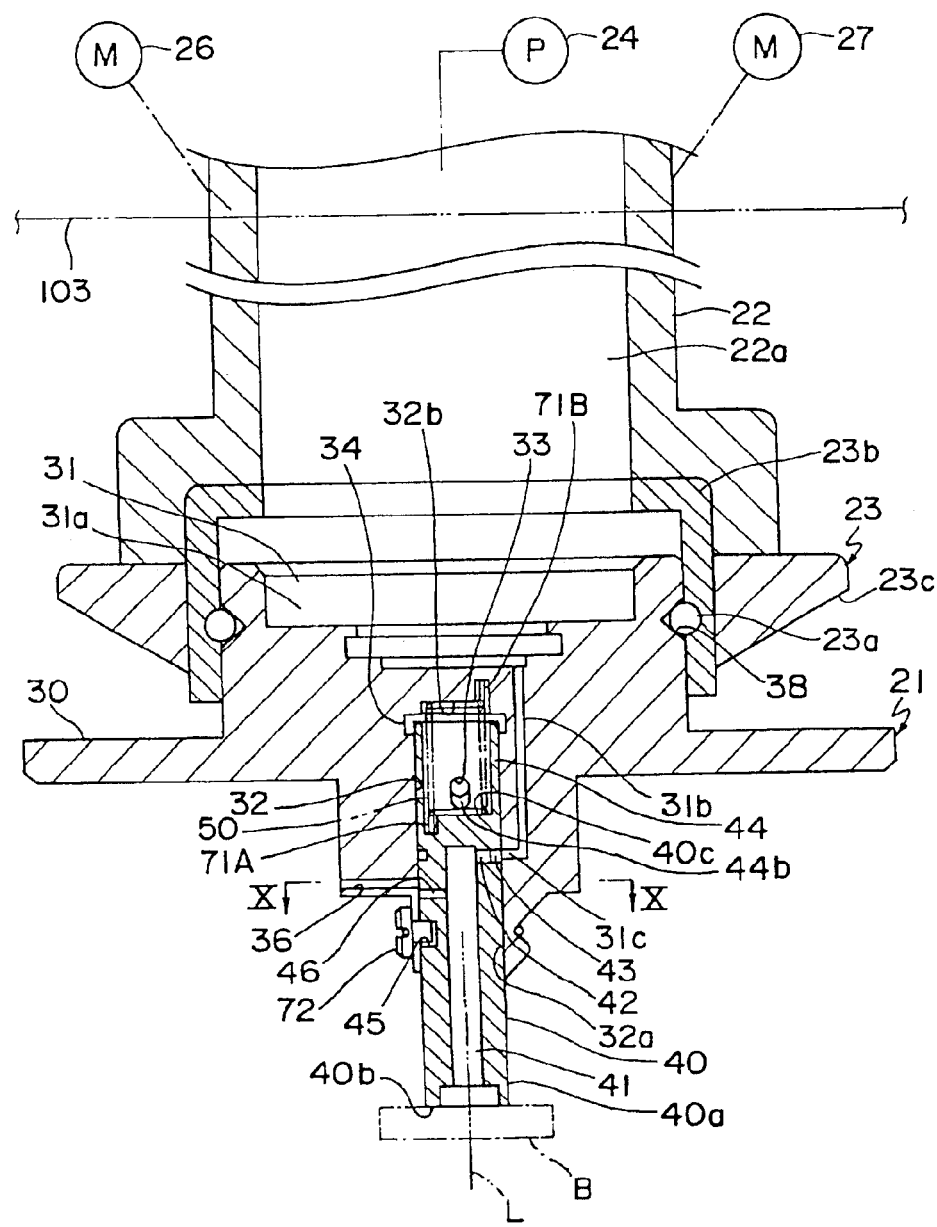
FIG. 8 is a vertical cross-sectional view illustrating a suction nozzle constructed in accordance with a third embodiment of the present invention.
Figure 9:
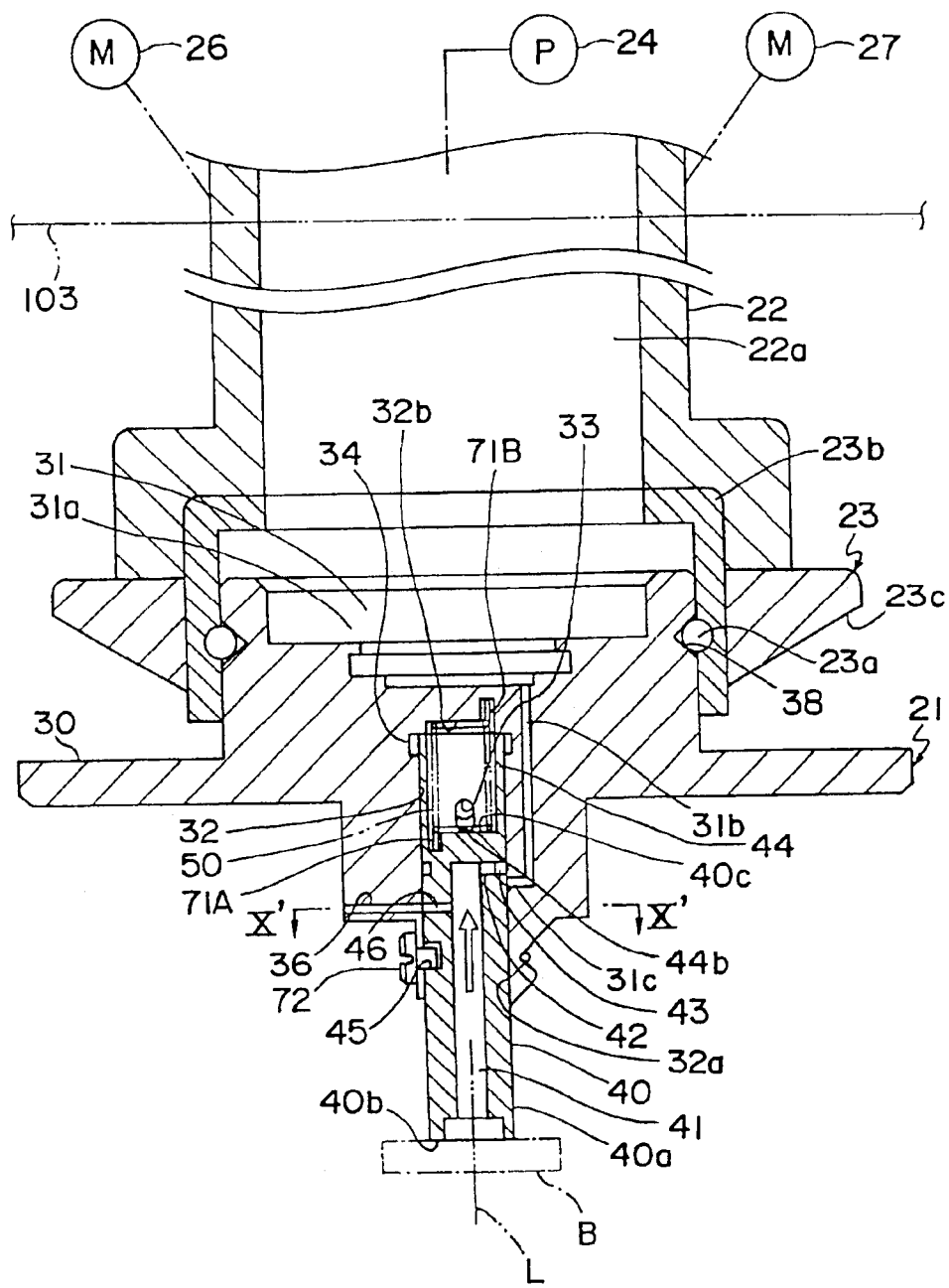
FIG. 9 is a vertical cross-sectional view illustrating the suction nozzle of the third embodiment of the present invention.

FIGS. 8 to 10 illustrate the third embodiment of the present invention. In the third embodiment, a first vacuum breaking passage 36 is formed in the outer nozzle member 30 and a second vacuum breaking passage 46 is formed in the nozzle body 40. The first vacuum breaking passage 36 communicates with atmosphere at one end thereof and is open at the side peripheral wall surface 32a of the nozzle body accommodation bore 32 at the other end thereof. The second vacuum breaking passage 46 communicates with the second suction passage 41 at one end thereof and is open at the outer side peripheral wall surface 40a of the nozzle body 40 at the other end thereof.

Figure 10A:
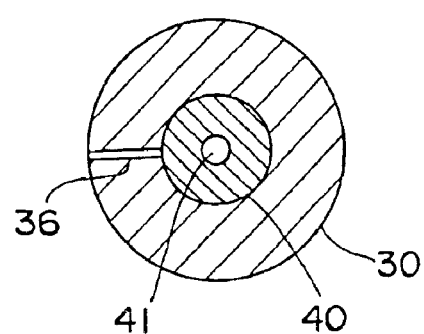
FIG. 10A is a cross-sectional view taken along line X—X in FIG. 8.

As shown in FIGS. 8 and 10A, when the nozzle body 40 is in the first position, the other ends of the first and second vacuum breaking passages 36, 46 are shut off from each other. In the first position, however, the first suction passage 31 and the second suction passage 41 communicate with each other. Therefore, when the nozzle body 40 is in the first position, the electronic component B is sucked at the distal end face 40b of the nozzle body 40 with the suction force of the vacuum suction pump 24 acting through the first and second suction passages 31, 41.

Figure 10B:
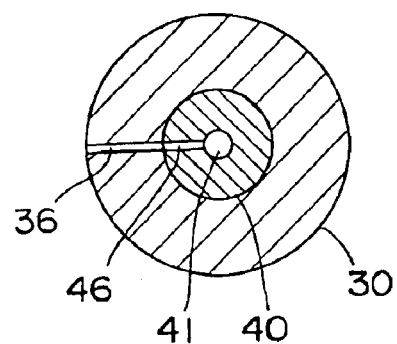
FIG. 10B is a cross-sectional view taken along line X'—X' in FIG. 9.

On the contrary, as shown in FIGS. 9 and 10B, when the nozzle body 40 is in the second position, the other ends of the first and second vacuum breaking passages 36, 46 communicate with each other. In the second position, however, the position of the annular groove 43 is displaced from the position of the third portion 31c of the first suction passage 31, blocking communication between the first and second suction passages 31, 41. Therefore, without a blowing action for releasing the electronic component B, only displacement of the nozzle body 40 to the second position and the halt of the suction of the vacuum suction pump 24 attain smooth and reliable release of sucking of the electronic component B at the distal end face 40b of the nozzle body 40.

For example, when the suction nozzle 21 sucking and holding the electronic component B at the nozzle body 40 is further lowered from the placement height position so that the nozzle body 40 reaches the second position and the suction of the vacuum suction pump 24 is halted, thee electronic component B is released from being sucked. The suction force no longer acts on the electronic component B during the further lowering of the suction nozzle 21 from the placement height position so as to apply a load to the electronic component B for placement on the circuit board A.

The other construction and function of the third embodiment are the same as those of the first embodiment described above. Therefore, the same components are denoted by the same reference numerals, and the description thereof is omitted.

Fourth Embodiment

Figure 11:
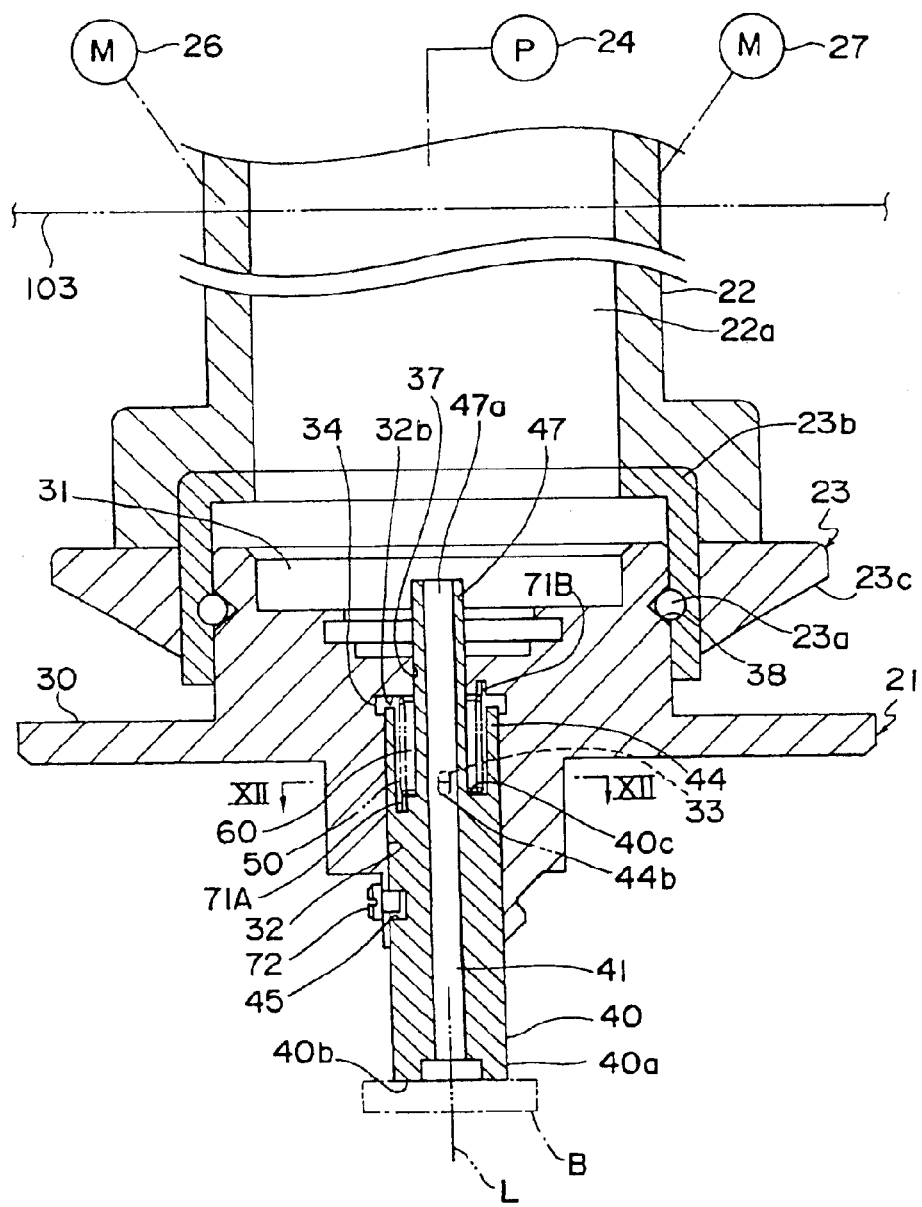
FIG. 11 is a vertical cross-sectional view illustrating a suction, nozzle constructed in accordance with a fourth embodiment of the present invention.
Figure 12:
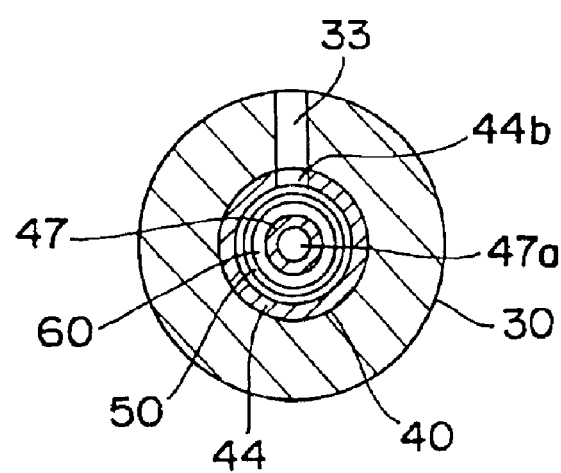
FIG. 12 is a cross-sectional view taken along line XII—XII in FIG. 11.

FIGS. 11 and 12 illustrate the fourth embodiment of the present invention. In the fourth embodiment, a second cylindrical portion 47 protrudes in the direction of the axis L coaxially with the first cylindrical portion 44. A third suction passage 47a formed through the second cylindrical portion 47 communicates with the second suction passage 41 at one end thereof and is open at the distal end face of the second cylindrical portion 47 at the other end thereof.

The outer nozzle member 30 has a through bore 37 extending from the bottom wall surface 32b of the nozzle body accommodation bore 32 to the first suction passage 31. The second cylindrical portion 47 extends through the spring accommodation chamber 60 and then the through hole 37 to the first suction passage 31.

The spring accommodation chamber 60 is defined by the side peripheral wall surface 32a and the bottom wall surface 32b of the nozzle body accommodation bore 32, the first cylindrical portion 44, and an outer side peripheral wall surface of the second cylindrical portion 47. As in the first embodiment, the spring accommodation chamber 60 communicates with atmosphere through the elliptical bore 44b formed through the first cylindrical portion 44 and the passage 33 formed through the outer nozzle member 30.

In the fourth embodiment, the first and second suction passages 31, 41 communicate with each other through the third suction passage 47a of the second cylindrical portion 47. With this construction, the spring accommodation chamber 60 is shut off more reliably from the first and second suction passages 31, 41.

The other construction and function of the fourth embodiment are the same as those of the first embodiment described above. Therefore, the same components are denoted by the same reference numerals, and the description thereof is omitted. The suction nozzle of the fourth embodiment may be provided with the first and second vacuum breaking passages of the third embodiment.

In the first through fourth embodiments, the spring accommodation chamber 60 communicates with atmosphere as described above. However, the spring accommodation chamber 60 may be an airtightly enclosed chamber shut off from not only the first and second suction passages 31, 41 but also atmosphere. This construction also achieves reduction of the suction force by the vacuum suction pump 24 acting on the nozzle body 40.

Although the present invention has been fully described by way of the examples with reference to the accompanying drawings, it is to be noted here that various changes and modifications will be apparent to those who are skilled in the art. Therefore, unless such changes and modifications otherwise depart from the spirit and scope of the present invention, they should be construed as being encompassed therein.

What is claimed is:

1. A suction nozzle for holding a component by suction, the suction nozzle comprising:
   an outer nozzle member defining a first suction passage for communicating with a suction source at one end thereof and a nozzle body accommodation bore;
   a nozzle body for holding the component at a distal end face thereof by suction, the nozzle body having a proximal side accommodated in the nozzle body accommodation bore so as to be slidable in a direction of an axis thereof, a distal side protruding from the outer nozzle member, and a first cylindrical portion protruding from a proximal end face thereof, the nozzle body defining a second suction passage extending in the axis direction thereof for communicating with the first suction passage, and the second suction passage having an opening at the distal end face of the nozzle body; and
   an urging member for urging the nozzle body in a direction away from the outer nozzle member, the urging member being accommodated in an urging member accommodation chamber defined by at least a wall surface of the nozzle body accommodation bore and a proximal end face of the nozzle body, the urging member accommodation chamber being shut from the first and second passages and communicated with atmosphere,
   wherein the nozzle body is movable against an urging force of the urging member from a first position where a distal end face of the first cylindrical portion is apart from a bottom wall surface of the nozzle body accommodation bore, to a second position where the distal end face of the first cylindrical portion contacts against the bottom wall surface of the nozzle body accommodation bore, wherein the nozzle body defines at least one lateral passage extending in a direction crossing the axis thereof, and wherein the lateral passage communicates with the second suction passage at one end thereof and communicates with the other end of the first suction passage of the outer nozzle member at the other end thereof.

2. A suction nozzle according to claim 1, wherein the nozzle body defines a single lateral passage.

3. A component mounting apparatus for placing a component on a circuit formation object, comprising:

a component feeder section for feeding the component;

a circuit formation object transfer section for transferring the circuit formation object to a component placement location; and a mounting head section provided with the suction nozzle according to claim 2, the mounting head section being moved from the component feeder section to the component placement location, wherein when the mounting head section is situated at a position corresponding to the component feeder section, the suction nozzle holds the component fed from the component feeder section by sucking the component at the distal end of the nozzle body, and wherein when mounting head section is situated at the component placement location, the suction nozzle moves toward the circuit formation object and places the component sucked at the distal end of the nozzle body onto the circuit formation object.

4. A suction nozzle according to claim 1, wherein the nozzle body defines two lateral passages, and wherein the lateral passages are arranged symmetrically with respect to the axis of the nozzle body.

5. A component mounting apparatus for placing a component on a circuit formation object, comprising:

a component feeder section for feeding the component;

a circuit formation object transfer section for transferring the circuit formation object to a component placement location; and a mounting head section provided with the suction nozzle according to claim 4, the mounting head section being moved from the component feeder section to the component placement location, wherein when the mounting head section is situated at a position corresponding to the component feeder section, the suction nozzle holds the component fed from the component feeder section by sucking the component at the distal end of the nozzle body, and wherein when mounting head section is situated at the component placement location, the suction nozzle moves toward the circuit formation object and places the component sucked at the distal end of the nozzle body onto the circuit formation object.

6. A suction nozzle according to claim 1, wherein a second annular groove is formed on an outer side peripheral wall surface of the nozzle body, and wherein the lateral passage communicates with the other end of the first suction passage through the second annular groove.

7. A component mounting apparatus for placing a component on a circuit formation object, comprising:

a component feeder section for feeding the component;

a circuit formation object transfer section for transferring the circuit formation object to a component placement location; and a mounting head section provided with the suction nozzle according to claim 6, the mounting head section being moved from the component feeder section to the component placement location, wherein when the mounting head section is situated at a position corresponding to the component feeder section, the suction nozzle holds the component fed from the component feeder section by sucking the component at the distal end of the nozzle body, and wherein when mounting head section is situated at the component placement location, the suction nozzle moves toward the circuit formation object and places the component sucked at the distal end of the nozzle body onto the circuit formation object.

8. A component mounting apparatus for placing a component on a circuit formation object, comprising:

a component feeder section for feeding the component;

a circuit formation object transfer section for transferring the circuit formation object to a component placement location; and a mounting head section provided with the suction nozzle according to claim 1, the mounting head section being moved from the component feeder section to the component placement location, wherein when the mounting head section is situated at a position corresponding to the component feeder section, the suction nozzle holds the component fed from the component feeder section by sucking the component at the distal end of the nozzle body, and wherein when mounting head section is situated at the component placement location, the suction nozzle moves toward the circuit formation object and places the component sucked at the distal end of the nozzle body onto the circuit formation object.

9. A suction nozzle for holding a component by suction, the suction nozzle comprising:

an outer nozzle member defining a first suction passage for communicating with a suction source at one end thereof and a nozzle body accommodation bore;

a nozzle body for holding the component at a distal end face thereof by suction, the nozzle body having a proximal side accommodated in the nozzle body accommodation bore so as to be slidable in a direction of an axis thereof, a distal side protruding from the outer nozzle member, and a first cylindrical portion protruding from a proximal end face thereof, the nozzle body defining a second suction passage extending in the axis direction thereof for communicating with the first suction passage, and the second suction passage having an opening at the distal end face of the nozzle body; and an urging member for urging the nozzle body in a direction away from the outer nozzle member, the urging member being accommodated in an urging member accommodation chamber defined by at least a wall surface of the nozzle body accommodation bore and a proximal end face of the nozzle body, the urging member accommodation chamber being shut from the first and second passages and communicated with atmosphere, wherein the nozzle body is movable against an urging force of the urging member from a first position where a distal end face of the first cylindrical portion is apart from a bottom wall surface of the nozzle body accommodation bore, to a second position where the distal end face of the first cylindrical portion contacts against the bottom wall surface of the nozzle body accommodation bore, wherein the outer nozzle member defines a first vacuum breaking passage communicating with atmosphere at one end thereof, wherein the nozzle body defines a second vacuum breaking passage communicating with the second suction passage at one end thereof, wherein the other ends of the first and second vacuum breaking passages are shut off from each other when the suction nozzle holds the component by suction, and wherein the other ends of the first and second vacuum breaking passages communicate with each other when the suction nozzle places the component onto a circuit formation object.

10. A component mounting apparatus for placing a component on a circuit formation object, comprising:

a component feeder section for feeding the component;

a circuit formation object transfer section for transferring the circuit formation object to a component placement location; and a mounting head section provided with the suction nozzle according to claim 9, the mounting head section being moved from the component feeder section to the component placement location, wherein when the mounting head section is situated at a position corresponding to the component feeder section, the suction nozzle holds the component fed from the component feeder section by sucking the component at the distal end of the nozzle body, and wherein when mounting head section is situated at the component placement location, the suction nozzle moves toward the circuit formation object and places the component sucked at the distal end of the nozzle body onto the circuit formation object.

11. A suction nozzle for holding a component by suction, the suction nozzle comprising:

an outer nozzle member defining a first suction passage for communicating with a suction source at one end thereof and a nozzle body accommodation bore;

a nozzle body for holding the component at a distal end face thereof by suction, the nozzle body having a proximal side accommodated in the nozzle body accommodation bore so as to be slidable in a direction of an axis thereof, a distal side protruding from the outer nozzle member, and a first cylindrical portion protruding from a proximal end face thereof, the nozzle body defining a second suction passage extending in the axis direction thereof for communicating with the first suction passage, and the second suction passage having an opening at the distal end face of the nozzle body; and an urging member for urging the nozzle body in a direction away from the outer nozzle member, the urging member being accommodated in an urging member accommodation chamber defined by at least a wall surface of the nozzle body accommodation bore and a proximal end face of the nozzle body, the urging member accommodation chamber being shut from the first and second passages and communicated with atmosphere, wherein the nozzle body is movable against an urging force of the urging member from a first position where a distal end face of the first cylindrical portion is apart from a bottom wall surface of the nozzle body accommodation bore, to a second position where the distal end face of the first cylindrical portion contacts against the bottom wall surface of the nozzle body accommodation bore, wherein the outer nozzle member defines first vacuum breaking passage communicating with atmosphere at one end thereof, wherein the nozzle body defines a second vacuum breaking passage communicating with the second suction passage at one end thereof, wherein the other ends of the first and second vacuum breaking passages are shut off from each other when the nozzle body is in the first position, and wherein the other ends of the first and second vacuum breaking passages communicate with each other when the nozzle body is in the second position, allowing the second suction passage to be open to atmosphere.

12. A component mounting apparatus for placing a component on a circuit formation object, comprising:

a component feeder section for feeding the component;

a circuit formation object transfer section for transferring the circuit formation object to a component placement location; and a mounting head section provided with the suction nozzle according to claim 11, the mounting head section being moved from the component feeder section to the component placement location, wherein when the mounting head section is situated at a position corresponding to the component feeder section, the suction nozzle holds the component fed from the component feeder section by sucking the component at the distal end of the nozzle body, and wherein when mounting head section is situated at the component placement location, the suction nozzle moves toward the circuit formation object and places the component sucked at the distal end of the nozzle body onto the circuit formation object.

* * * * *